United States Patent
Park et al.

(10) Patent No.: US 11,821,106 B2
(45) Date of Patent: Nov. 21, 2023

(54) SEMICONDUCTOR PROCESS CHAMBER INCLUDING LOWER VOLUME UPPER DOME

(71) Applicant: Samsung Electronics Co., Ltd., Suwon-si (KR)

(72) Inventors: Keum Seok Park, Seoul (KR); Gyeom Kim, Hwaseong-si (KR); Yi Hwan Kim, Seongnam-si (KR); Sun Jung Kim, Suwon-si (KR); Pan Kwi Park, Incheon (KR); Jeong Ho Yoo, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 491 days.

(21) Appl. No.: 15/869,905

(22) Filed: Jan. 12, 2018

(65) Prior Publication Data

US 2018/0355510 A1 Dec. 13, 2018

(30) Foreign Application Priority Data

Jun. 7, 2017 (KR) .................. 10-2017-0070659

(51) Int. Cl.
*C30B 25/12* (2006.01)
*C23C 16/458* (2006.01)
(Continued)

(52) U.S. Cl.
CPC .......... *C30B 25/12* (2013.01); *C23C 16/4585* (2013.01); *H01L 29/0847* (2013.01); *H01L 29/66636* (2013.01); *H01L 29/66795* (2013.01)

(58) Field of Classification Search
None
See application file for complete search history.

(56) References Cited

U.S. PATENT DOCUMENTS 5,085,887 A * 2/1992 Adams .................. C23C 16/481
118/724
5,226,967 A * 7/1993 Chen ................. H01J 37/32082
315/111.21
(Continued)

FOREIGN PATENT DOCUMENTS

CN 101110381 A 1/2008
JP 6052070 12/2016
(Continued)

OTHER PUBLICATIONS

Communication dated Sep. 13, 2021, issued by the Korean Patent Office in counterpart Korean Patent Application No. 10-2017-0070659.
(Continued)

*Primary Examiner* — Jeffrie R Lund
*Assistant Examiner* — Tiffany Z Nuckols
(74) *Attorney, Agent, or Firm* — Sughrue Mion, PLLC

(57) ABSTRACT

A semiconductor process chamber includes a susceptor, a base plate surrounding the susceptor, a liner on an inner sidewall of the base plate, and a preheat ring between the susceptor and the base plate and coplanar with the susceptor. The process chamber further includes an upper dome coupled to the base plate and covering an upper surface of the susceptor. The upper dome includes a first section on an upper surface of the base plate and a second section extending from the first section and overlapping the susceptor. The first section includes a first region on the upper surface of the base plate, a second region extending from the first region past the base plate, and a third region extending from the second region with a decreasing thickness to contact the second section.

20 Claims, 8 Drawing Sheets

(51) Int. Cl.
*H01L 29/66* (2006.01)
*H01L 29/08* (2006.01)

(56) References Cited

U.S. PATENT DOCUMENTS

| | | | | |
|---|---|---|---|---|
| 5,234,526 | A * | 8/1993 | Chen | H01J 37/32192 118/252 |
| 5,306,985 | A * | 4/1994 | Berry | H01J 37/32238 118/723 MR |
| 5,368,710 | A * | 11/1994 | Chen | C23C 16/507 204/192.32 |
| 5,690,781 | A * | 11/1997 | Yoshida | H01J 37/32458 156/345.48 |
| 6,437,290 | B1 * | 8/2002 | Shao | C23C 16/481 118/724 |
| 7,785,419 | B2 * | 8/2010 | Tateishi | C23C 16/4585 118/724 |
| 8,980,005 | B2 * | 3/2015 | Carlson | C23C 16/45574 118/715 |
| 2002/0056414 | A1 | 5/2002 | Shim et al. | |
| 2008/0017104 | A1 | 1/2008 | Matyushkin et al. | |
| 2014/0261185 | A1 * | 9/2014 | Aboagye | C23C 16/45563 118/728 |
| 2014/0326185 | A1 | 11/2014 | Lau et al. | |
| 2014/0376897 | A1 | 12/2014 | Ranish et al. | |
| 2015/0013595 | A1 | 1/2015 | Janzen et al. | |
| 2015/0047566 | A1 | 2/2015 | Sanchez et al. | |
| 2015/0083046 | A1 * | 3/2015 | Ranish | C23C 16/4408 118/724 |
| 2015/0162230 | A1 * | 6/2015 | Bautista | C30B 25/10 118/725 |
| 2015/0184313 | A1 | 7/2015 | Yoshitake et al. | |
| 2015/0194298 | A1 | 7/2015 | Lei et al. | |
| 2016/0020086 | A1 * | 1/2016 | Tsai | H01L 21/67115 117/89 |
| 2016/0348275 | A1 | 12/2016 | Oki et al. | |
| 2017/0170148 | A1 | 6/2017 | Fasano et al. | |

FOREIGN PATENT DOCUMENTS

| | | |
|---|---|---|
| KR | 2002-0029190 A | 4/2002 |
| KR | 10-1237868 | 2/2013 |
| KR | 10-2016-0003846 | 1/2016 |
| KR | 10-2016-0022885 A | 3/2016 |
| KR | 10-2016-043115 | 4/2016 |

OTHER PUBLICATIONS

Office Action dated Feb. 27, 2023, issued by Chinese Patent Office for Chinese Application No. 201810567895.5.

* cited by examiner

I-I' ical Field

Example embodiments of the present disclosure relate to a process chamber, and, more particularly, to a semiconductor process chamber including an upper dome.

Discussion of Related Art

As the integration of semiconductor integrated circuits becomes higher, individual elements, such as transistors, constituting a semiconductor integrated circuit become smaller. Such transistors may include a source/drain formed by an epitaxial process. As the trend toward higher integration increases, the size of the source/drain is gradually decreasing. Process defects may increase as the epitaxial process for forming the source/drain of reduced size is performed using a conventional semiconductor process chamber.

SUMMARY

According to some example embodiments of the inventive concepts, a semiconductor process chamber includes a susceptor, a base plate surrounding the susceptor, an upper clamp ring coupled to an upper surface of the base plate, a lower clamp ring coupled to a lower surface of the base plate and a liner on an inner sidewall of the base plate. The process chamber further includes a lower dome extending from the base plate and the lower clamp ring and covering a lower surface of the susceptor and an upper dome extending from the base plate and the upper clamp ring and covering an upper surface of the susceptor. The upper dome includes a first section coupled between the base plate and the upper clamp ring and a second section extending from the first section and more transparent than the first section. The first section includes a first region disposed between the base plate and the upper clamp ring, a second region extending from the first region and having a lower surface contacting an upper surface of the liner, and a third region extending from the second region with a decreasing thickness in a direction away from the second region. The lower surface of the second region is coplanar with a lower surface of the first region.

Further embodiments provide a semiconductor process chamber including a susceptor, a base plate surrounding the susceptor, a liner on an inner sidewall of the base plate, and a preheat ring between the susceptor and the base plate and coplanar with the susceptor. The process chamber further includes an upper dome coupled to the base plate and covering an upper surface of the susceptor. The upper dome includes a first section on an upper surface of the base plate and a second section extending from the first section and overlapping the susceptor. The first section includes a first region on the upper surface of the base plate, a second region extending from the first region past the base plate, and a third region extending from the second region with a decreasing thickness to contact the second section.

Additional example embodiments provide a semiconductor process chamber including a susceptor, a base plate surrounding the susceptor, an upper dome coupled to the base plate and disposed above the susceptor, a lower dome coupled to the base plate and disposed below the susceptor and a liner on an inner sidewall of the base plate between the upper dome and the lower dome. The chamber further includes an upper reflector configured to reflect light towards the susceptor through the upper dome, upper lamps coupled to the upper reflector, a lower reflector configured to reflect light towards the susceptor through the lower dome and lower lamps coupled to the lower reflector. The upper dome includes a first section and a second section extending from the first section. The second section is more transparent than the first section and includes a portion positioned at a higher level than the first section. The first section includes a first region on an upper surface of the base plate, a second region extending from the first region past the base plate, and a third region extending from the second region with a decreasing thickness in a direction away from the second region to contact the second section.

DETAILED DESCRIPTION

Figure 1:
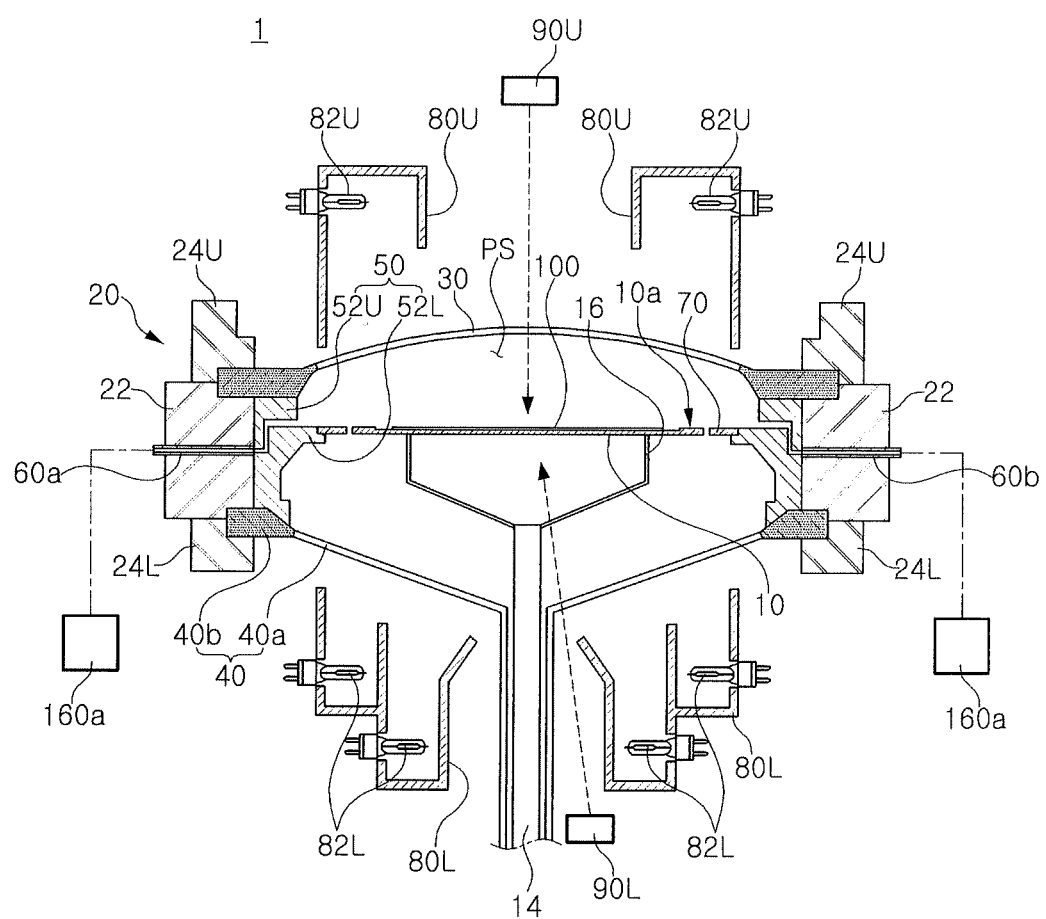
FIG. 1 is a conceptual cross-sectional view illustrating a semiconductor process chamber according to example embodiments.

Various example embodiments will now be described more fully hereinafter with reference to the accompanying drawings. Like reference numerals may refer to like elements throughout this application.

FIG. 1 is a conceptual cross-sectional view illustrating a semiconductor process chamber according to example embodiments.

Referring to FIG. 1, a semiconductor process chamber 1 may include a susceptor 10, a base plate assembly 20, an upper dome 30, a lower dome 40, a liner assembly 50, and a processing space PS. The susceptor 10 may include a wafer guard portion 10a surrounding a sidewall of a semiconductor wafer 100 to be placed thereon. The base plate assembly 20 may be spaced apart from the susceptor 10 and may include a portion surrounding a sidewall of the susceptor 10. The base plate assembly 20 may include a base plate 22 surrounding the susceptor 10, an upper clamp ring 24U coupled to an upper surface of the base plate 22, and a lower clamp ring 24L coupled to a lower surface of the base plate 22.

The upper dome 30 may be coupled to the base plate assembly 20 and may be disposed above and vertically spaced apart from the susceptor 10. The upper dome 30 may be disposed between the base plate 22 and the upper clamp ring 24U and may extend from between the base plate 22 and the upper clamp ring 24U to cover an upper surface of the susceptor 10. The processing space PS may be a space between the upper dome 30 and the susceptor 10.

The lower dome 40 may be disposed below the susceptor 10 and may be coupled to the base plate assembly 20. The lower dome 40 may include an opaque section 40b between the base plate 22 and the lower clamp ring 24L and a transparent section 40a extending from the opaque section 40b to below the susceptor 10.

The liner assembly 50 may be disposed on an inner sidewall of the base plate assembly 20 between the upper dome 30 and the lower dome 40. The liner assembly 50 may be disposed on an inner sidewall of the base plate 22. The base plate 22 may include a metal material. The liner assembly 50 may include a material, such as quartz, capable of protecting the base plate 22 from a process gas to be introduced into the processing space PS.

The liner assembly 50 may include a first liner 52U and a second liner 52L. The first liner 52U may contact the inner sidewall of the base plate 22 and the upper dome 30. The second liner 52L may contact the inner sidewall of the base plate 22 and the lower dome 40.

The semiconductor process chamber 1 may include a gas inlet passage 60a and a gas outlet passage 60b that pass through the base plate 22 and the liner assembly 50 to communicate with the processing space PS. In some embodiments, the gas inlet passage 60a and the gas outlet passage 60b may be positioned opposite to each other. The gas inlet passage 60a may be connected to a gas supply source 160 that supplies the process gas to the processing space PS. The gas outlet passage 60b may be connected to a vacuum pump 160b that exhausts air, the process gas, and/or process by-products.

The semiconductor process chamber 1 may include a preheat ring 70 disposed between the susceptor 10 and the liner assembly 50 and connected to the liner assembly 50. The preheat ring 70 may surround the susceptor 10. The preheat ring 70 may be coupled to or connected to a portion of the second liner 52L of the liner assembly 50 and may be spaced apart from the susceptor 10. The preheat ring 70 may be coplanar with the susceptor 10.

The semiconductor process chamber 1 may include a plurality of pins 16 supporting the susceptor 10 from below and a shaft structure 14 disposed below and coupled to the plurality of pins 16. The semiconductor process chamber 1 may further include a lower reflector 80L below the lower dome 40, lower lamps 82L coupled to the lower reflector 80L, an upper reflector 80U above the upper dome 30, and upper lamps 82U coupled to the upper reflector 80U. Each of the upper reflector 80U and the lower reflector 80L may include an inner space opened toward the susceptor 10. The lower lamps 82L may be disposed in the inner space of the lower reflector 80L. The upper lamps 82U may be disposed in the inner space of the upper reflector 80U.

The semiconductor process chamber 1 may include an upper temperature sensor 90U disposed in an upper region thereof and a lower temperature sensor 90L disposed in a lower region thereof. The upper temperature sensor 90U may be disposed toward the semiconductor wafer 100 to measure a temperature of the semiconductor wafer 100 during a semiconductor process in the processing space PS. The lower temperature sensor 90L may be disposed toward the susceptor 10 to measure a temperature of the susceptor 10.

The upper lamps 82U and the lower lamps 82L may supply heat required for performing the semiconductor process in the semiconductor process chamber 1. For example, the lower lamps 82L may directly heat a lower surface of the susceptor 10 and a lower surface of the preheat ring 70. In some embodiments, light reflected by the lower reflector 80L may heat the lower surface of the susceptor 10 and the lower surface of the preheat ring 70. Heating light generated by the upper lamps 82U may directly heat an upper surface of the preheat ring 70, a portion of the upper surface of the susceptor 10, and the semiconductor wafer 100. In some embodiments, heating light reflected by the upper reflector 80U may heat the upper surface of the preheat ring 70, the upper surface of the susceptor 10, and the semiconductor wafer 100.

The susceptor 10 and the preheat ring 70 may include a material capable of being heated by the heating light generated by the upper and lower lamps 82U and 82L. The susceptor 10 and the preheat ring 70 may include, for example, opaque silicon carbide and/or coated graphite.

The susceptor 10 and the preheat ring 70 may absorb heat generated from the upper and lower lamps 82U and 82L. The absorbed heat may be radiated from the susceptor 10 and the preheat ring 70. Therefore, the process gas introduced into the processing space PS from the gas inlet passage 60a may flow onto a surface of the semiconductor wafer 100 while being heated by the preheat ring 70.

In example embodiments, the upper dome 30 may have a shape that limits a volume of the processing space PS in comparison to a conventional semiconductor processing apparatus, thus reducing a time taken until a temperature in the processing space PS reaches a target process temperature, and reducing a process temperature variation during semiconductor processing. Such a shape of the upper dome 30 will be described with reference to FIGS. 2A, 2B, and 3A to 3E, wherein FIG. 2A is a plan view illustrating the upper dome 30 of the semiconductor process chamber 1 and FIG. 2B is a cross-sectional view taken along line I-I' of FIG. 2A.

Figure 2A:
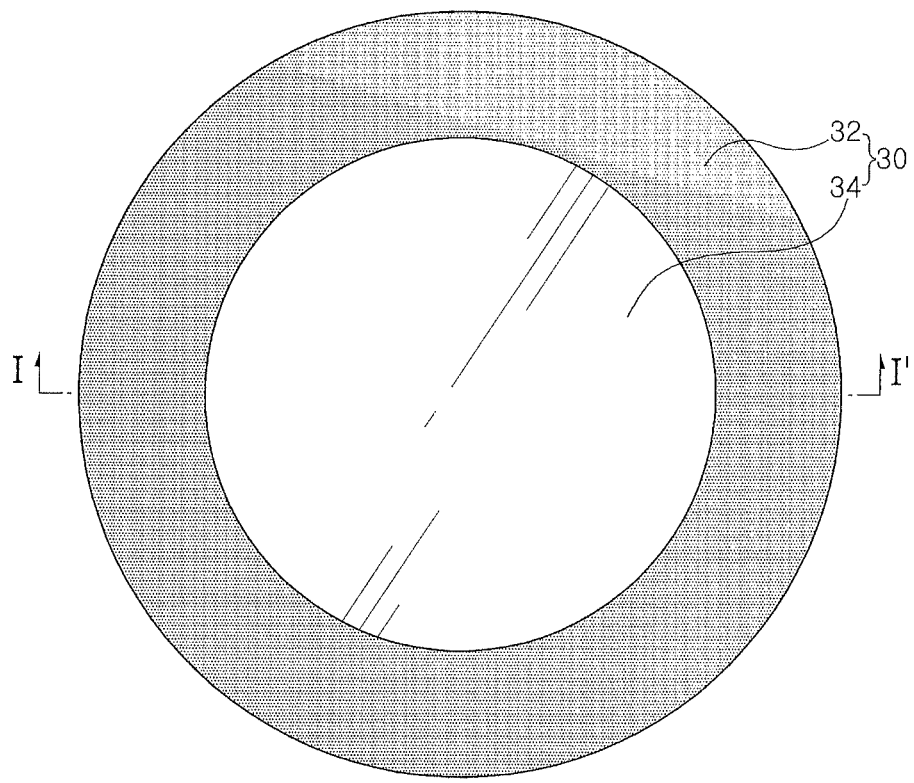
FIG. 2A is a plan view illustrating an upper dome according to example embodiments.
Figure 2B:
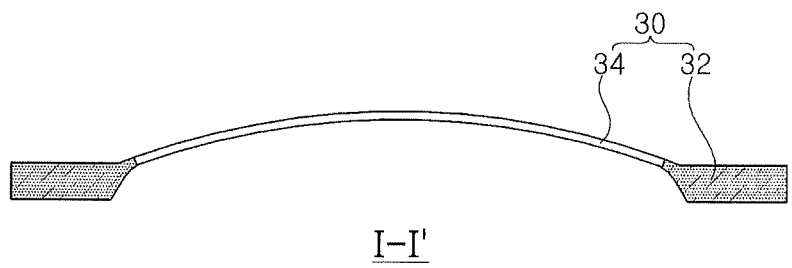
FIG. 2B is a cross-sectional view taken along line I-I' of FIG. 2A.

Referring to FIGS. 1, 2A and 2B, the upper dome 30 may include a first section 32 and a second section 34 extending from the first section 32 and more transparent than the first section 32. In some example embodiments, the first section 32 may be an opaque section and the second section 34 may be a transparent section. The first section 32 may include, for example, opaque quartz or glass, and the second section 34 may include, for example, transparent quartz or glass.

In plan view, the upper dome 30 may have a circular shape. In plan view, the second section 34 may have a circular shape, and the second section 34 may be a ring-shaped region surrounding the first section 32. The second section 34 may include a portion positioned at a higher level than the first section 32. In particular, a central region of the second section 34 may be positioned at a higher level than the first section 32.

Various example embodiments of the first section 32 of the upper dome 30 and configuration elements related to the first section 32 will be described with FIGS. 3A, 3B, 3C, 3D, and 3E, which are conceptual cross-sectional views illustrating example embodiments of a portion of the semiconductor process chamber 1. Referring to FIGS. 1, 2A, 2B and 3A, in the upper dome 30, the first section 32 may include a first region A1 coupled to the base plate 22 and the upper clamp ring 24U, a second region A2 extending from the first region A1 and contacting the liner assembly 50, and a third region A3 extending from the second region A2 with a decreasing thickness in a direction away from the second region A2. The first section 32 of the upper dome 30 may be coupled to the base plate 22 and the upper clamp ring 24U using an O-ring 38. In the first section 32 of the upper dome 30, the second region A2 extending from the first region A1 may reduce the volume of the processing space PS.

In some embodiments, in the first section 32 of the upper dome 30, a lower surface of the second region A2 may be substantially coplanar with a lower surface of the first region A1 In some embodiments, in the first section 32 of the upper dome 30, the second region A2 may extend from the first region A1 without reducing in thickness. In some embodiments, in the first section 32 of the upper dome 30, the second region A2 may have substantially the same thickness as the first region A1. In some embodiments, in the first section 32 of the upper dome 30, the second region A2 may have substantially the same thickness as the first region A1 and may extend from the first region A1 to contact the liner assembly 50.

In some embodiments, the second section 34 of the upper dome 30 may overlap the susceptor 10.

In some embodiments, a boundary 35 between the first and second sections 32 and 34 of the upper dome 30 may overlap the second liner 52L of the liner assembly 50. The boundary 35 between the first and second sections 32 and 34 of the upper dome 30 may not overlap the susceptor 10.

In some embodiments, the boundary 35 between the first and second sections 32 and 34 of the upper dome 30 may not overlap the preheat ring 70.

In some embodiments, the third region A3 of the first section 32 of the upper dome 30 may overlap the liner assembly 50 and may not overlap the preheat ring 70.

In some embodiments, the first liner 52U of the liner assembly 50 may contact the lower surface of the second region A2 of the first section 32 of the upper dome 30 and may support the upper dome 30, but the inventive concepts are not limited thereto. For example, the first liner 52U of the liner assembly 50 may extend below the third region A3 of the first section 32 while contacting the lower surface of the second region A2 of the first section 32, as shown in FIG. 3B.

Figure 3A:
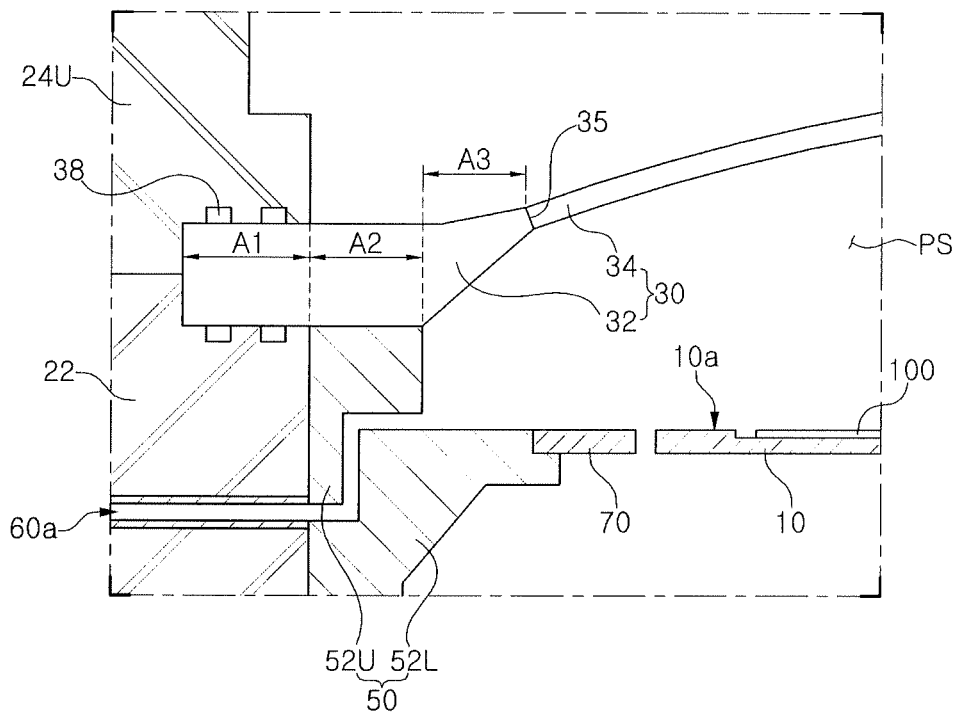
FIGS. 3A, 3B, 3C, 3D, and 3E are conceptual cross-sectional views illustrating a portion of the semiconductor process chamber of FIG. 1 according to example embodiments.
Figure 3B:
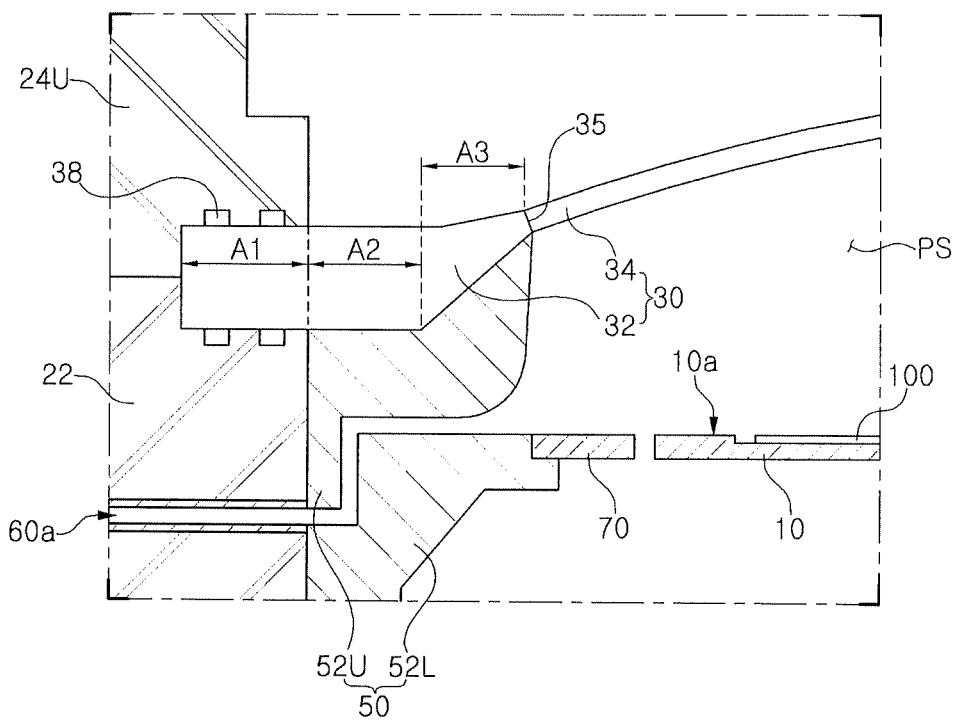

As shown in FIG. 3A, in the first section 32 of the upper dome 30, a length of the first region A1, coupled to the base plate assembly 20, may be greater than a length of the second region A2 extending laterally toward the processing space PA without reducing in thickness, but the inventive concepts are not limited thereto. For example, as shown in FIG. 3C, the second region A2 extending laterally toward the processing space PA without reducing in thickness may have a greater length than the length of the first region A1.

Figure 3C:
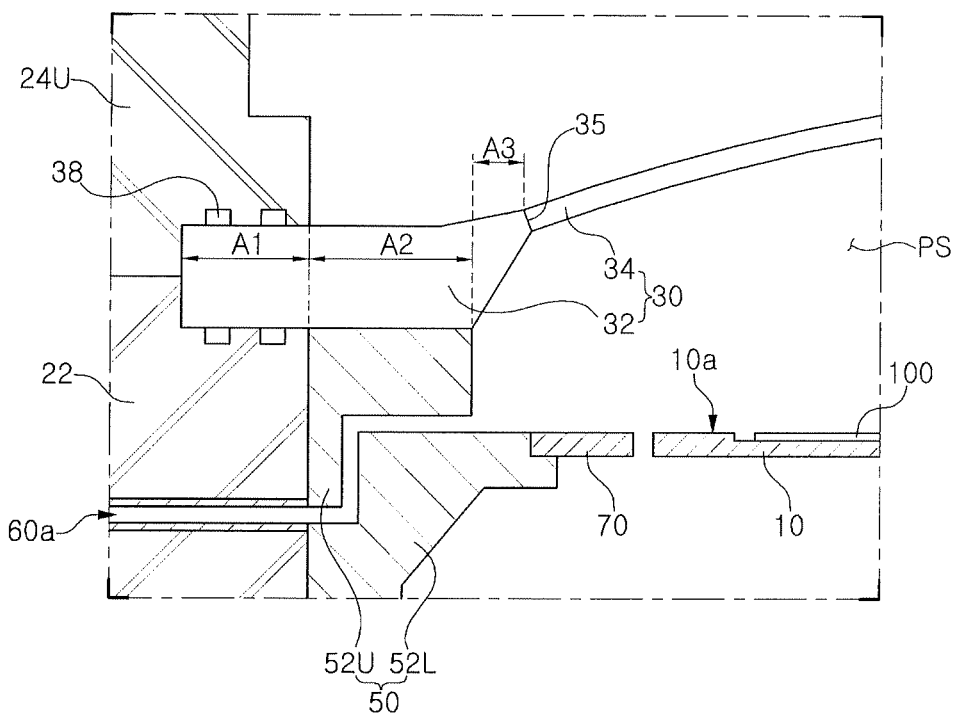
Figure 3D:
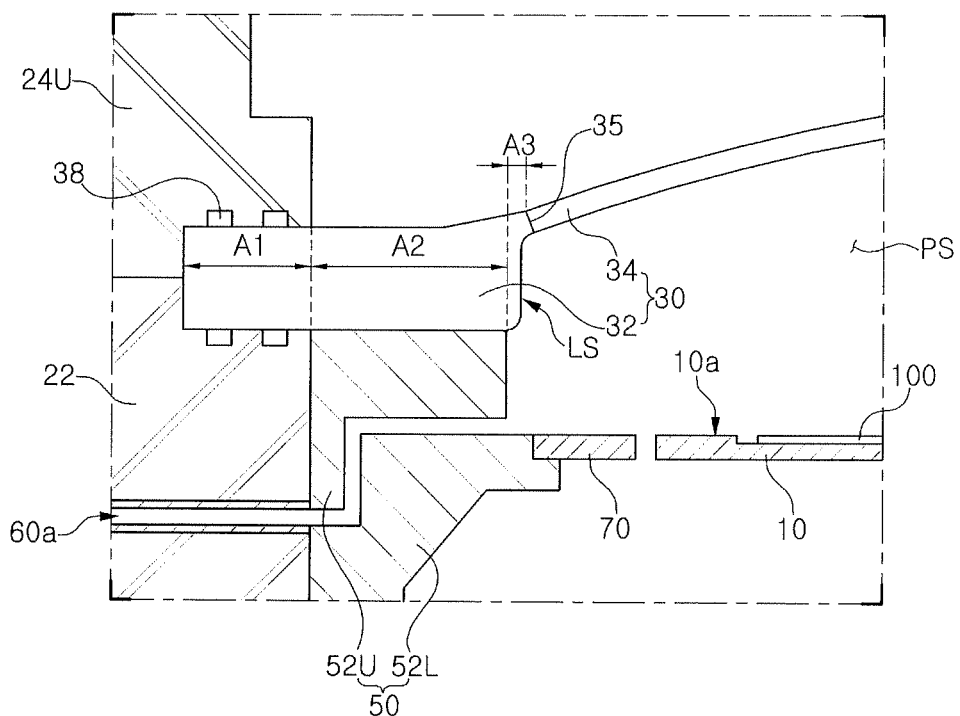

As shown in FIG. 3C, a lower surface of the third region A3 of the first section 32 of the upper dome 30 may be sloped, but the inventive concepts are not limited thereto. For example, as shown in FIG. 3D, the third region A3 of the first section 32 of the upper dome 30 may have a substantially vertical surface LS. For example, the third region A3 may have the substantially vertical surface LS exposed by the processing space PS.

Figure 3E:
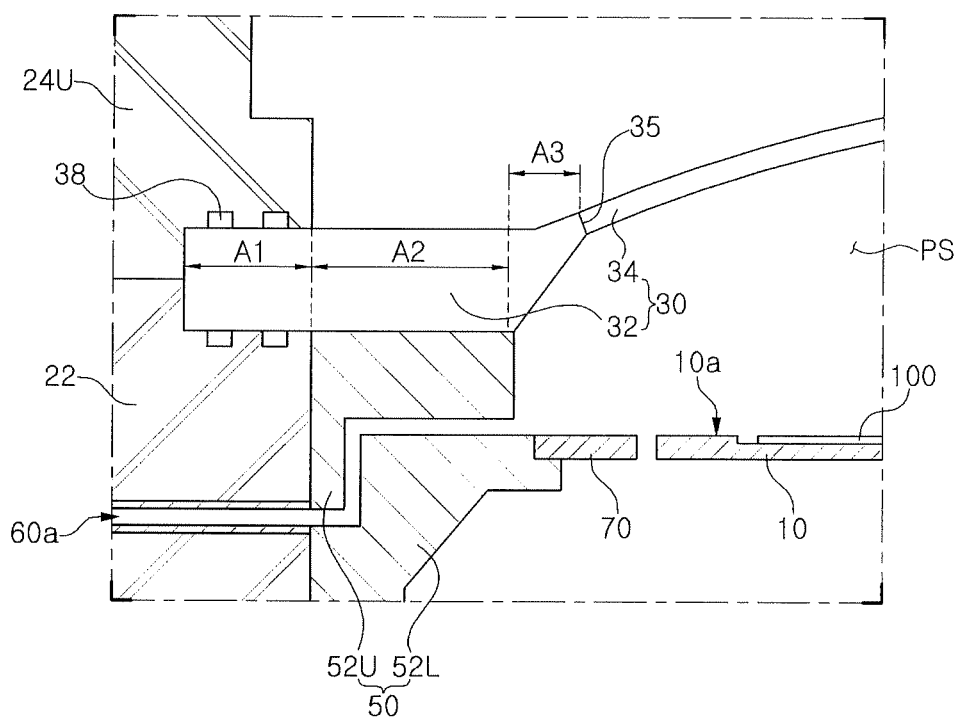

In some embodiments, as shown in FIG. 3A, the first section 32 of the upper dome 30 may overlap the liner assembly 50 and may not overlap the preheat ring 70, but the inventive concepts are not limited thereto. For example, as shown in FIG. 3E, at least a portion of the first section 32 of the upper dome 30, e.g., at least a portion of the third region A3, may overlap the preheat ring 70.

In the first section 32 of the upper dome 30 described with reference to FIGS. 3A to 3E, the second region A2 extending from the first region A1 without reducing in thickness may reduce the volume of the processing space PS.

Figure 4A:
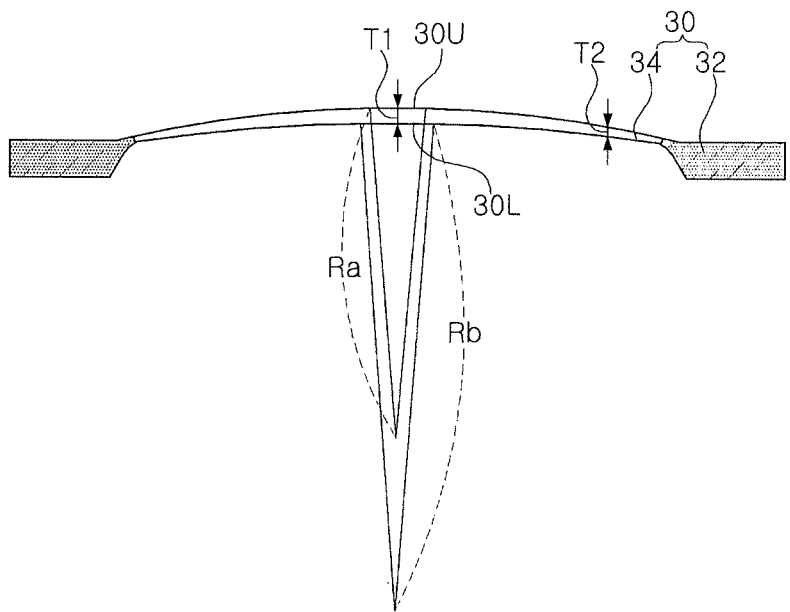
FIGS. 4A, 4B, and 4C are cross-sectional views illustrating an upper dome according to example embodiments.
Figure 4B:
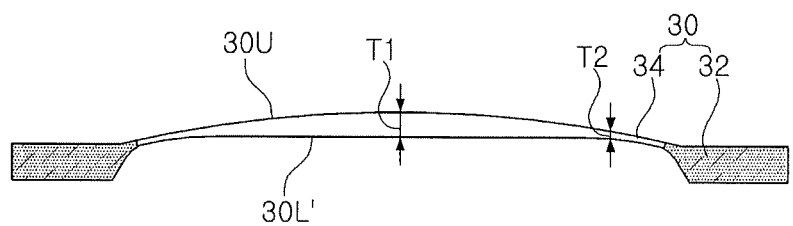
Figure 4C:
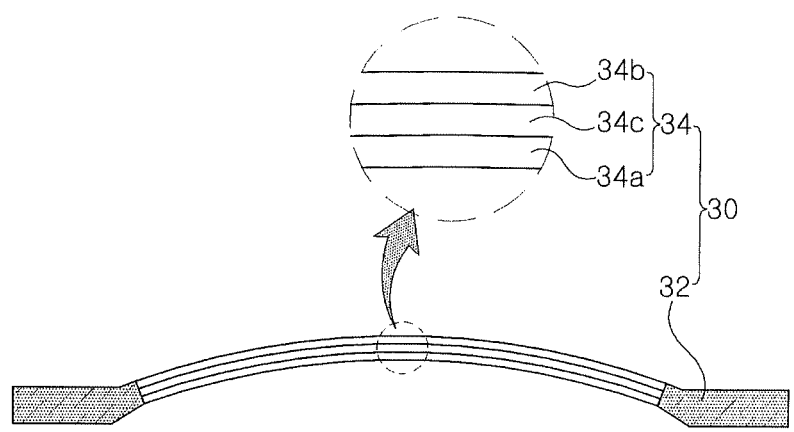

In example embodiments, a shape of the second section 34 of the upper dome 30 may be configured to limit the volume of the processing space PS. Example embodiments of the second section 34 of the upper dome 30 will be described with reference to FIGS. 4A, 4B and 4C. FIGS. 4A, 4B and 4C are cross-sectional views illustrating example embodiments of the upper dome 30 in the semiconductor process chamber 1.

Referring to FIG. 4A, in the upper dome 30, the second section 34 may have a bend region that is bent in an upward direction or upwardly convex in a direction away from the susceptor 10 (refer to FIG. 1). The bend region of the second section 34 of the upper dome 30 may have an upper surface 30U having a first radius of curvature Ra and a lower surface 30L having a second radius of curvature Rb greater than the first radius of curvature Ra.

In some embodiments, in the upper dome 30, the second section 34 may include a region having a gradually increasing thickness in a direction away from the first section 32.

In some embodiments, in the upper dome 30, the second section 34 may include a first thickness region T1 and a second thickness region T2. The first thickness T1 may be thicker than the second thickness region T2. The second thickness region T2 may be closer to the first section 32 than the first thickness region T1.

Referring to FIG. 4B, at least a portion of the second section 34 of the upper dome 30 may have a flat lower surface 30L' and a convex upper surface 30U bent in the upward direction. The second section 34 of the upper dome 30 may include the first thickness region T1 and the second thickness region T2 thinner than the first thickness region T1. The second thickness region T2 may be closer to the first section 32 than the first thickness region T1.

Referring to FIG. 4C, the second section 34 of the upper dome 30 may have a multi-layered structure. For example, in the upper dome 30, the second section 34 may include a first layer 34a, a second layer 34b on the first layer 34a, and a hollow space 34c between the first layer 34a and second layer 34b. The first and second layers 34a and 34b may be connected to the first section 32 of the upper dome 30.

Figure 5:
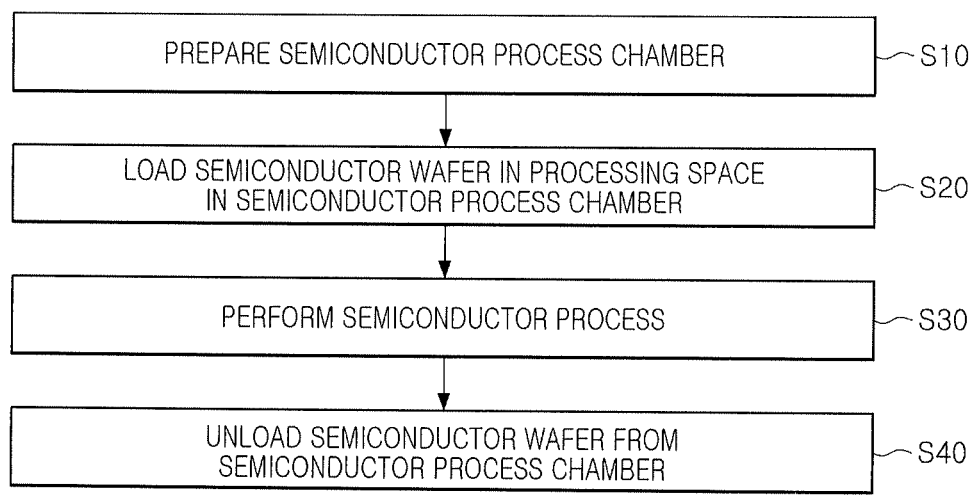
FIG. 5 is a flow chart illustrating a semiconductor processing method using a semiconductor process chamber according to example embodiments.
Figure 6A:
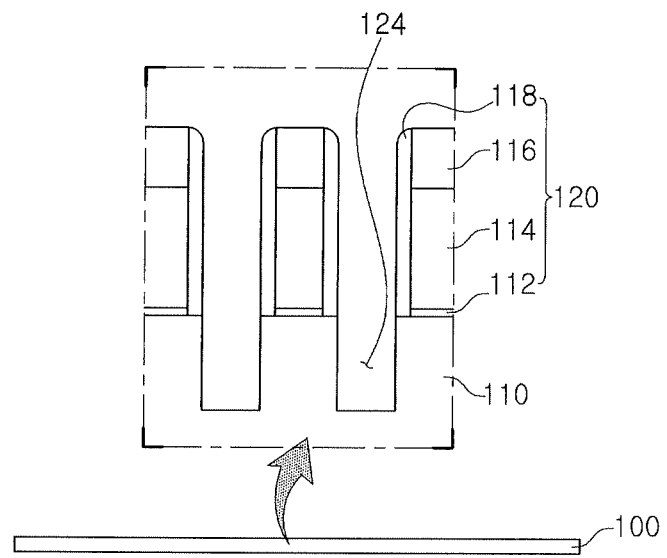
FIGS. 6A and 6B are cross-sectional views illustrating a semiconductor processing method using a semiconductor process chamber according to example embodiments.
Figure 6B:
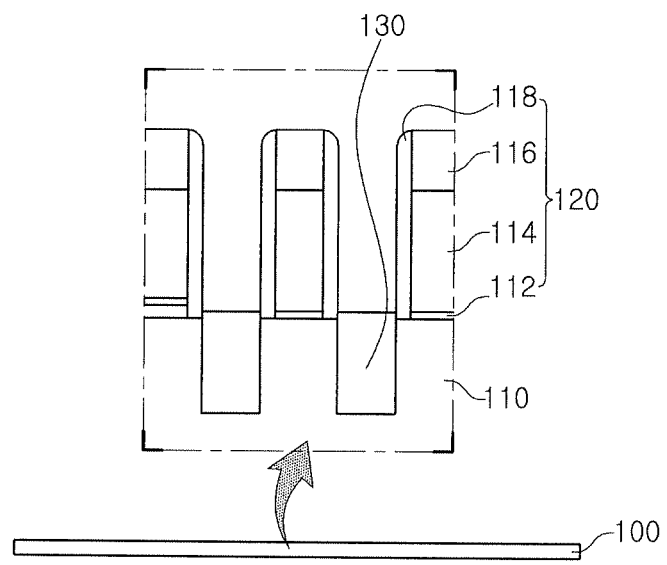

According to some example embodiments, the semiconductor process chamber 1 including the upper dome 30, including any one of the example embodiments of the first section 32 described with reference to FIGS. 3A to 3E and/or any one of the example embodiments of the second section 34 described with reference to FIGS. 4A to 4C, may be provided. Example embodiments of operations for fabricating a semiconductor device using the aforementioned semiconductor process chamber 1 will be described with reference to FIGS. 5, 6A, and 6B. FIG. 5 is a flow chart illustrating a semiconductor processing method using the semiconductor process chamber 1 according to example embodiments. FIGS. 6A and 6B are cross-sectional views illustrating a semiconductor processing method using the semiconductor process chamber 1 according to example embodiments.

Referring to FIGS. 1, 5 and 6A, in operation S10, the semiconductor process chamber 1 as described with reference to FIG. 1 may be prepared. In operation S20, the semiconductor wafer 100 may be loaded in the processing space PS in the semiconductor process chamber 1. The semiconductor wafer 100 may be placed on the susceptor 10. The semiconductor wafer 100 may be fixed on the susceptor 10 by a vacuum pressure transmitted through the plurality of pins 16 below the susceptor 10.

The semiconductor wafer 100 may include a semiconductor substrate 110, gate structures 120 on the semiconductor substrate 110, and recess regions 124 at opposite sides of the gate structures 120. Each of the gate structures 120 may include a gate dielectric layer 112, a gate electrode 114, and an insulating capping pattern 116 that are sequentially stacked. Additionally, the gate structures 120 may include insulating spacers 118 on sidewalls of stack structures each including the gate dielectric layer 112, the gate electrode 114, and an insulating capping pattern 116.

Referring to FIGS. 1, 5 and 6B, in operation S30, a semiconductor process may be performed. The semiconductor process may be performed in the semiconductor process chamber 1 including the upper dome 30 including at least one of the first sections 32 described with reference to FIGS. 3A to 3E and/or at least one of the second sections 34 described with reference to FIGS. 4A to 4C.

The semiconductor process may include rising a temperature in the processing space PS to a target process temperature using the upper and lower lamps 82U and 82L and supplying a process gas provided from the gas supplying source 160a to the processing space PS through the gas inlet passage 60a to form epitaxial semiconductor layers 130 filling the recess regions 124 (refer to FIG. 6A), respectively. The epitaxial semiconductor layers 130 may be used as source/drains of a transistor. The process gas and/or process by-products remaining in the processing space PS may be exhausted outside the processing space PS through the gas outlet passage 60b. In operation S40, the semiconductor wafer 100 may be unloaded from the semiconductor process chamber 1.

As described with reference to FIGS. 3A to 3E, in the first section 32 of the upper dome 30, the second region A2 extending from the first region A1 without reducing in thickness may reduce the volume of the processing space PS. Additionally, as described with reference to FIGS. 4A to 4C, the second section 34 of the upper dome 30 may reduce the volume of the processing space PS. The process gas introduced into the reduced volume processing space PS may be rapidly heated up at the desired process temperature. Additionally, since a process temperature variation during the semiconductor process is reduced due to the reduced volume processing space PS, the semiconductor process may be performed at a substantially uniform process temperature. Thus, when the epitaxial semiconductor layers 130 are formed in the processing space PS having the volume reduced by the upper dome 30, a time taken for the epitaxial semiconductor layers 130 to be formed may be reduced, and defects occurring during the formation of the epitaxial semiconductor layers 130 may be reduced. Therefore, the productivity may be increased when the semiconductor process is performed using the semiconductor process chamber 1 according to the example embodiments.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A semiconductor process chamber comprising:
a susceptor;
a base plate surrounding the susceptor;
an upper clamp ring coupled to an upper surface of the base plate;
a lower clamp ring coupled to a lower surface of the base plate;
a liner on an inner sidewall of the base plate;
a lower dome extending from the base plate and the lower clamp ring and covering a lower surface of the susceptor; and
an upper dome extending from the base plate and the upper clamp ring and covering an upper surface of the susceptor, the upper dome comprising:
a first section coupled between the base plate and the upper clamp ring; and
a second section extending from the first section and more transparent than the first section,
wherein the first section includes a first region disposed between the base plate and the upper clamp ring, a second region extending from the first region, overlapping the liner completely in a plan view and having a lower surface contacting an upper surface of the liner, and a third region extending from the second region with a decreasing thickness in a direction away from the second region, and wherein the lower surface of the second region is coplanar with a lower surface of the first region,
wherein the second section includes a portion positioned at a higher level than the first section,
wherein a boundary between the first section and the second section is positioned at a higher level than an upper end of the second region,
wherein the second section of the upper dome includes a fourth region in the center of the upper dome, and a fifth region between the third region of the first section and the fourth region of the second section,
wherein the fourth region has a thickness greater that the fifth region, and
wherein the second section of the upper dome has a curved upper surface with a first radius of curvature and a curved lower surface with a second radius of curvature greater than the first radius of curvature.

2. The semiconductor process chamber according to claim 1, further comprising a preheat ring disposed between the susceptor and the liner,
wherein at least a portion of the third region overlaps the preheat ring in a plan view, and
wherein the boundary between the first section and the second section is positioned at a higher level than an upper end of the first region,
wherein the liner comprises a first liner and a second liner,
wherein the inner sidewall of the base plate directly contacts the first liner,
wherein the first liner is disposed on the second liner,
wherein an entire upper surface of the first liner directly contacts the first section,
wherein the entire lower surface of the second region and an lower surface of the first region are coplanar with each other,
wherein the preheat ring directly contacts the second liner and is spaced apart from the susceptor,
wherein the second liner comprises an upper surface vertically overlapping the third region of the first section, wherein an upper surface of the preheat ring and the upper surface of the second liner are coplanar with each other, wherein the preheat ring includes a first ring portion vertically overlapping the third region, and a second ring portion extending from the first ring portion and vertically overlapping the second section, wherein the first liner includes an upper body, and a lower body below the upper body and extending from a portion of the upper body, wherein the lower body has a first lower surface, a first side surface contacting the base plate, and a second side surface opposing the first side surface, wherein the upper body has a second lower surface, and wherein the second liner has a first surface facing and spaced apart from a first lower surface of the lower body, a second surface facing and spaced apart from the second side surface of the lower body, and a third surface facing and spaced apart from the second lower surface of the upper body.

3. The semiconductor process chamber according to claim 1, wherein the second region has the same thickness as the first region, and wherein the second region joins the first region.

4. The semiconductor process chamber according to claim 1, wherein entire portion of the second region has the same thickness as the first region.

5. The semiconductor process chamber according to claim 1, wherein fifth region is provided in the periphery of the upper dome, and wherein the fifth region of the second section is closer to the first section of the upper dome than the fourth region of the second section.

6. The semiconductor process chamber according to claim 1, wherein at least a portion of the second section of the upper dome has a lower surface that is flat and an upper surface that is convex.

7. The semiconductor process chamber according to claim 1, wherein the second section of the upper dome comprises a first layer, a second layer, and a space between the first and second layers.

8. The semiconductor process chamber according to claim 1, further comprising:

an upper reflector above the upper dome;
upper lamps coupled to the upper reflector;
a lower reflector below the lower dome; and
lower lamps coupled to the lower reflector.

9. The semiconductor process chamber according to claim 1, wherein in the plan view, the third region extends beyond an edge of the preheat ring directly contacting the liner.

10. The semiconductor process chamber according to claim 1, wherein a lower surface of the second region is coplanar with an upper surface of the liner.

11. The semiconductor process chamber according to claim 1, wherein the liner comprises a first liner and a second liner, wherein the second liner extends further into the chamber than the first liner, and wherein the third region overhangs above the second liner.

12. The semiconductor process chamber according to claim 11, wherein the third region overhangs above the second liner and a preheat ring provided between the susceptor and the liner.

13. A semiconductor process chamber comprising:

a susceptor;
a base plate surrounding the susceptor;
a liner assembly on an inner sidewall of the base plate;
a preheat ring between the susceptor and the base plate, and surrounding the susceptor; and
an upper dome coupled to the base plate and covering an upper surface of the susceptor, the upper dome comprising:
a first section on an upper surface of the base plate; and
a second section extending from the first section and overlapping the susceptor, wherein the first section comprises a first region on the upper surface of the base plate, a second region extending from the first region past the base plate, overlapping the liner assembly completely in a plan view, and a third region extending from the second region with a decreasing thickness to contact the second section, wherein the second section is more transparent than the first section and includes a portion positioned at a higher level than the first section, and wherein a boundary between the first section and the second section is positioned at a higher level than an upper end of the second region, wherein the second section of the upper dome includes a fourth region in the center of the upper dome, and a fifth region between the third region of the first section and the fourth region of the second section, wherein the fourth region has a thickness greater that the fifth region, wherein the liner assembly comprises a first liner and a second liner, wherein the inner sidewall of the base plate directly contacts the first liner, wherein the first liner is disposed on the second liner, wherein an entire upper surface of the first liner directly contacts the first section, wherein an entire lower surface of the second region and an lower surface of the first region are coplanar with each other, wherein the preheat ring directly contacts the second liner and is spaced apart from the susceptor, wherein the second liner comprises an upper surface vertically overlapping the third region of the first section, wherein an upper surface of the preheat ring and the upper surface of the second liner are coplanar with each other, wherein the preheat ring includes a first ring portion vertically overlapping the third region, and a second ring portion extending from the first ring portion and vertically overlapping the second section, wherein the first liner includes an upper body, and a lower body below the upper body and extending from a portion of the upper body, wherein the lower body has a first lower surface, a first side surface contacting the base plate, and a second side surface opposing the first side surface, wherein the upper body has a second lower surface, wherein the second liner has a first surface facing and spaced apart from a first lower surface of the lower body, a second surface facing and spaced apart from the second side surface of the lower body, and a third surface facing and spaced apart from the second lower surface of the upper body wherein the second section of the upper dome has a curved upper surface with a first radius of curvature and a curved lower surface with a second radius of curvature greater than the first radius of curvature.

14. The semiconductor process chamber according to claim 13, wherein the boundary between the first section and the second section is positioned at a higher level than an upper end of the first region, and wherein an entire upper surface of the first liner directly contacts an entire lower surface of the second region of the first section.

15. The semiconductor process chamber according to claim 13, wherein the second region and the third region contact an upper surface of the liner.

16. The semiconductor process chamber according to claim 13, wherein the second section gradually increases in thickness in a direction away from the first section.

17. A semiconductor process chamber comprising:
a susceptor;
a base plate surrounding the susceptor;
an upper dome coupled to the base plate and disposed above the susceptor;
a lower dome coupled to the base plate and disposed below the susceptor;
a liner assembly on an inner sidewall of the base plate between the upper dome and the lower dome;
an upper reflector configured to reflect light towards the susceptor through the upper dome;
upper lamps coupled to the upper reflector; dome;
a lower reflector configured to reflect light towards the susceptor through the lower lower lamps coupled to the lower reflector; and
a preheat ring between the liner and the susceptor, and coplanar with the susceptor,
wherein the upper dome includes a first section and a second section extending from the first section, wherein the second section is more transparent than the first section and includes a portion positioned at a higher level than the first section, and
wherein the first section includes a first region on an upper surface of the base plate, a second region extending from the first region past the base plate, overlapping the liner assembly completely in a plan view, and a third region extending from the second region with a decreasing thickness in a direction away from the second region to contact the second section,
wherein the boundary between the first section and the second section is positioned at a higher level than an upper end of the second region,
wherein the second section of the upper dome includes a fourth region in the center of the upper dome, and a fifth region between the third region of the first section and the fourth region of the second section,
wherein the fourth region has a thickness greater that the fifth region,
wherein the liner assembly comprises a first liner and a second liner, wherein the inner sidewall of the base plate directly contacts the first liner, wherein the first liner is disposed on the second liner, wherein an entire upper surface of the first liner directly contacts the first section, wherein an entire lower surface of the second region and an lower surface of the first region are coplanar with each other, wherein the preheat ring directly contacts the second liner and is spaced apart from the susceptor, wherein the second liner comprises an upper surface vertically overlapping the third region of the first section, wherein an upper surface of the preheat ring and the upper surface of the second liner are coplanar with each other, wherein the preheat ring includes a first ring portion vertically overlapping the third region, and a second ring portion extending from the first ring portion and vertically overlapping the second section, wherein the first liner includes an upper body, and a lower body below the upper body and extending from a portion of the upper body, wherein the lower body has a first lower surface, a first side surface contacting the base plate, and a second side surface opposing the first side surface, wherein the upper body has a second lower surface, wherein the second liner has a first surface facing and spaced apart from a first lower surface of the lower body, a second surface facing and spaced apart from the second side surface of the lower body, and a third surface facing and spaced apart from the second lower surface of the upper body, and wherein the second section of the upper dome has a curved upper surface with a first radius of curvature and a curved lower surface with a second radius of curvature greater than the first radius of curvature.

18. The semiconductor process chamber according to claim 17, wherein at least a portion of the third region overlaps the preheat ring in a plan view.

19. The semiconductor process chamber according to claim 17, wherein the susceptor includes a wafer guard portion that surrounds a semiconductor wafer placed on the susceptor, and
wherein a boundary between the first section and the second section is positioned at a higher level than an upper end of the first region.

20. The semiconductor process chamber according to claim 17, wherein fifth region is provided in the periphery of the upper dome, and
wherein the fifth region is closer to the first section than the fourth region.

* * * * *